(12) United States Patent
Tanaka (10) Patent No.: US 10,727,306 B2
(45) Date of Patent: Jul. 28, 2020

(54) SEMICONDUCTOR APPARATUS

(71) Applicant: Mitsubishi Electric Corporation, Tokyo (JP)

(72) Inventor: Sho Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/233,830

(22) Filed: Dec. 27, 2018

(65) Prior Publication Data

US 2019/0333999 A1    Oct. 31, 2019

(30) Foreign Application Priority Data

Apr. 26, 2018   (JP) .................................. 2018-084941

(51) Int. Cl.
| | |
|---|---|
| *H01L 29/66* | (2006.01) |
| *H01L 29/40* | (2006.01) |
| *H01L 29/739* | (2006.01) |

(52) U.S. Cl.
CPC ........ *H01L 29/407* (2013.01); *H01L 29/7397* (2013.01)

(58) Field of Classification Search
CPC .......................... H01L 29/407; H01L 29/7397
USPC ....................................................... 257/139
See application file for complete search history.

(56) References Cited

U.S. PATENT DOCUMENTS

| | | | | | |
|---|---|---|---|---|---|
| 7,233,031 | B2* | 6/2007 | Mauder | ............... | H01L 29/0834 |
| | | | | | 257/163 |
| 8,102,025 | B2* | 1/2012 | Ozeki | ................. | H01L 27/0611 |
| | | | | | 257/577 |
| 8,168,999 | B2* | 5/2012 | Tsuzuki | ................ | H01L 29/167 |
| | | | | | 257/143 |
| 8,274,095 | B2* | 9/2012 | Hisamoto | ........... | H01L 29/0619 |
| | | | | | 257/139 |
| 8,648,385 | B2* | 2/2014 | Kouno | ................ | H01L 29/0619 |
| | | | | | 257/140 |
| 8,841,699 | B2* | 9/2014 | Tsuzuki | ................ | H01L 21/263 |
| | | | | | 257/138 |
| 8,963,198 | B2* | 2/2015 | Takahashi | ............. | H01L 29/404 |
| | | | | | 257/139 |
| 9,147,758 | B2* | 9/2015 | Senoo | ................. | H01L 29/7397 |
| 9,653,557 | B2* | 5/2017 | Matsudai | .............. | H01L 29/404 |

(Continued)

FOREIGN PATENT DOCUMENTS

| | | |
|---|---|---|
| JP | H11-204789 A | 7/1999 |
| JP | 2008-277597 A | 11/2008 |
| JP | 2009-141067 A | 6/2009 |

*Primary Examiner* — Vu A Vu
(74) *Attorney, Agent, or Firm* — Studebaker & Brackett PC (57) ABSTRACT

A semiconductor apparatus includes a semiconductor substrate. Semiconductor substrate includes an active region and a peripheral region surrounding active region. Semiconductor substrate has a front surface and a back surface. A semiconductor device includes an n⁻ drift region and a p⁺ collector layer. Peripheral region includes n⁻ drift region and a p⁺ back surface peripheral layer. P⁺ back surface peripheral layer is provided on the back surface side of n⁻ drift region. A first hole concentration in p⁺ back surface peripheral layer is higher than a second hole concentration in p⁺ collector layer. The short-circuit capability of semiconductor apparatus is improved.

18 Claims, 5 Drawing Sheets

(56) References Cited

U.S. PATENT DOCUMENTS

| | | | |
|---|---|---|---|
| 9,941,269 B2* | 4/2018 | Nakamura | H01L 29/404 |
| 2012/0217541 A1* | 8/2012 | Hsieh | H01L 29/7397 |
| | | | 257/140 |
| 2015/0187877 A1* | 7/2015 | Park | H01L 29/407 |
| | | | 257/139 |

* cited by examiner

SEMICONDUCTOR APPARATUS

BACKGROUND OF THE INVENTION

Field of the Invention

The present invention relates to semiconductor apparatuses.

Description of the Background Art

Japanese Patent Laying-Open No. 2009-141067 discloses a semiconductor apparatus including an active region and a peripheral region surrounding the active region. A semiconductor device such as an insulated gate bipolar transistor (IGBT) is formed in the active region. A guard ring is formed in the peripheral region for ensuring the breakdown voltage of the semiconductor device.

SUMMARY OF THE INVENTION

An object of the present invention is to improve the short-circuit capability of a semiconductor apparatus.

A semiconductor apparatus of the present invention includes a semiconductor substrate. The semiconductor substrate includes an active region and a peripheral region surrounding the active region. The semiconductor substrate has a front surface and a back surface. A semiconductor device includes an n⁻ drift region and a p⁺ collector layer. The peripheral region includes the n⁻ drift region and a p⁺ back surface peripheral layer. The p⁺ back surface peripheral layer is provided on the back surface side of the n⁻ drift region. A first hole concentration in the p⁺ back surface peripheral layer is higher than a second hole concentration in the p⁺ collector layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described below. It should be noted that the same components are designated by the same reference numbers and will not be described repeatedly.

First Embodiment

Figure 1:
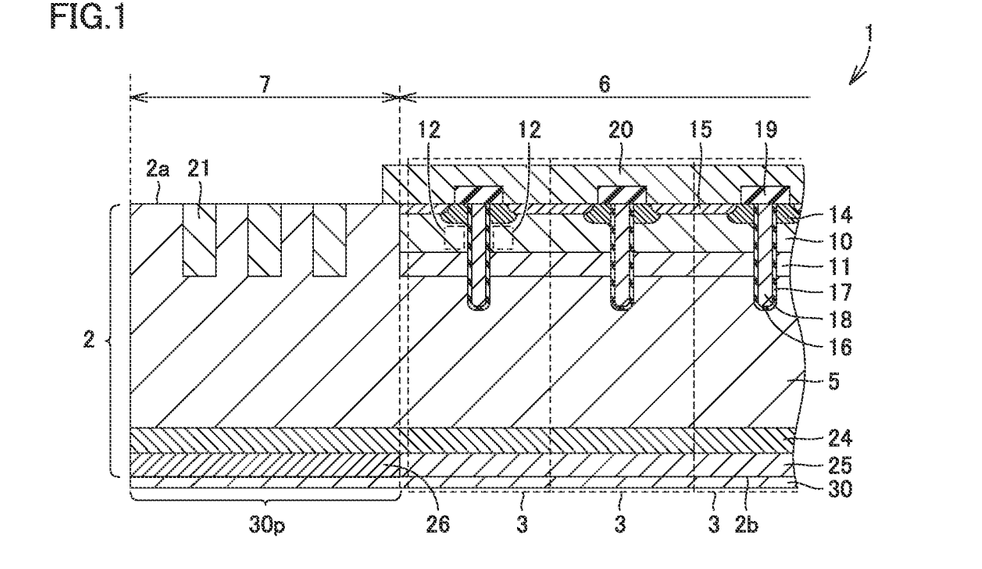
FIG. 1 is a schematic partial enlarged sectional view of a semiconductor apparatus according to a first embodiment.

Referring to FIG. 1, a semiconductor apparatus 1 according to a first embodiment is described. Semiconductor apparatus 1 mainly includes a semiconductor substrate 2, a first electrode 20 and a second electrode 30.

Semiconductor substrate 2 is a silicon substrate or a silicon carbide substrate, for example. Semiconductor substrate 2 has a front surface 2a, and a back surface 2b opposite to front surface 2a. Semiconductor substrate 2 includes an active region 6 in which a semiconductor device 3 is provided, and a peripheral region 7 surrounding active region 6. Semiconductor device 3 is an insulated gate bipolar transistor (IGBT), for example.

Semiconductor device 3 includes an n⁻ drift region 5, a p base region 10, an n⁺ type emitter region 14, a gate insulating film 17, a gate electrode 18, a p⁺ collector layer 25, first electrode 20, and second electrode 30. Semiconductor device 3 further includes an n buffer layer 24 and a p⁺ contact layer 15. Semiconductor device 3 further includes an n⁺ charge storage layer 11.

P base region 10 is provided closer to front surface 2a than n⁻ drift region 5. P base region 10 is formed to a first depth from front surface 2a. N⁺ charge storage layer 11 is formed between n⁻ drift region 5 and p base region 10. An n type carrier (electron) concentration in n⁺ charge storage layer 11 is higher than an n type carrier concentration in n⁻ drift region 5.

N⁺ type emitter region 14 is formed in a portion of p base region 10. Specifically, n⁺ type emitter region 14 is formed to a second depth from front surface 2a. The second depth is smaller than the first depth. N⁺ type emitter region 14 is formed in a portion of front surface 2a. A p type carrier (hole) concentration in p⁺ contact layer 15 is higher than a p type carrier concentration in p base region 10. P⁺ contact layer 15 is formed in a portion of front surface 2a where n⁺ type emitter region 14 is not formed.

Gate insulating film 17 is provided on a portion 12 of p base region 10 sandwiched between n⁺ type emitter region 14 and n⁻ drift region 5. During ON operation of semiconductor device 3, a channel is formed in portion 12 of p base region 10. Specifically, gate insulating film 17 is formed on a side wall and a bottom surface of a trench 16 which extends through n⁺ type emitter region 14, p base region 10 and n⁺ charge storage layer 11 to reach n⁻ drift region 5. Gate insulating film 17 is a SiO₂ film, for example.

Gate electrode 18 faces portion 12 of p base region 10 with gate insulating film 17 interposed therebetween. As one example, gate electrode 18 is a trench gate electrode, and semiconductor device 3 is a trench gate IGBT. Gate electrode 18 is provided within trench 16 with gate insulating film 17 interposed therebetween.

N buffer layer 24 is provided closer to back surface 2b than n⁻ drift region 5. N buffer layer 24 is in contact with n⁻ drift region 5 and p⁺ collector layer 25 in active region 6. A first n type carrier concentration in n buffer layer 24 is higher than a second n type carrier concentration in n⁻ drift region 5. N buffer layer 24 includes an n type dopant. The n type dopant is phosphorus or arsenic, for example. N buffer layer 24 has a smaller thickness than n⁻ drift region 5. In one example, the thickness of n buffer layer 24 is 0.5 times or less the thickness of n⁻ drift region 5. In another example, the thickness of n buffer layer 24 is 0.3 times or less the thickness of n⁻ drift region 5. In yet another example, the thickness of n buffer layer 24 is 0.1 times or less the thickness of n⁻ drift region 5. N buffer layer 24 has a thickness of 0.1 µm or more, for example.

P⁺ collector layer 25 is provided on back surface 2b of semiconductor substrate 2. P⁺ collector layer 25 is provided closer to back surface 2b than n⁻ drift region 5. P⁺ collector layer 25 is in contact with n buffer layer 24. P⁺ collector layer 25 includes a p type dopant such as boron. A p type carrier (hole) concentration in p⁺ collector layer 25 is higher than the p type carrier concentration in p base region 10. P⁺ collector layer 25 has a thickness of 0.1 µm or more, for example. P⁺ collector layer 25 has a thickness of 10 µm or less, for example.

Semiconductor device 3 further includes first electrode 20 and second electrode 30. First electrode 20 is formed on n⁺ type emitter region 14 at front surface 2a. First electrode 20 is also formed on p⁺ contact layer 15 at front surface 2a. First electrode 20 is in contact with n⁺ type emitter region 14 and p⁺ contact layer 15. First electrode 20 functions as an emitter electrode. First electrode 20 is electrically connected to p base region 10 with p⁺ contact layer 15 interposed therebetween. First electrode 20 is electrically insulated from gate electrode 18 by an interlayer insulating film 19. Second electrode 30 is formed on p⁺ collector layer 25 in active region 6. Second electrode 30 is in contact with p⁺ collector layer 25. Second electrode 30 functions as a collector electrode.

Peripheral region 7 includes n⁻ drift region 5 and a p⁺ back surface peripheral layer 26. N⁻ drift region 5 and second electrode 30 extend from active region 6 to peripheral region 7 as well. Peripheral region 7 includes n buffer layer 24. N buffer layer 24 extends from active region 6 to peripheral region 7 as well. P base region 10, n⁺ type emitter region 14 and n⁺ charge storage layer 11 are not formed in peripheral region 7. Second electrode 30 is formed on p⁺ back surface peripheral layer 26 in peripheral region 7.

P⁺ back surface peripheral layer 26 is provided on the back surface 2b side of n⁻ drift region 5. P⁺ back surface peripheral layer 26 is formed between n⁻ drift region 5 and second electrode 30. P⁺ back surface peripheral layer 26 is in contact with n⁻ buffer layer 24. P⁺ back surface peripheral layer 26 is in contact with second electrode 30. P⁺ back surface peripheral layer 26 is formed on back surface 2b of semiconductor substrate 2. P⁺ back surface peripheral layer 26 is in contact with p⁺ collector layer 25. P⁺ back surface peripheral layer 26 has a thickness of 0.1 µm or more and 10 µm or less, for example.

A first p type carrier concentration in p⁺ back surface peripheral layer 26 is higher than a second p type carrier concentration in p⁺ collector layer 25. In one example, the first p type carrier concentration in p⁺ back surface peripheral layer 26 is twice or more the second p type carrier concentration in p⁺ collector layer 25. In another example, the first p type carrier concentration in p⁺ back surface peripheral layer 26 is five times or more the second p type carrier concentration in p⁺ collector layer 25. In yet another example, the first p type carrier concentration in p⁺ back surface peripheral layer 26 is ten times or more the second p type carrier concentration in p⁺ collector layer 25. In one example, in a plan view of back surface 2b of semiconductor substrate 2, p⁺ back surface peripheral layer 26 is formed to surround active region 6. In another example, in the plan view of back surface 2b of semiconductor substrate 2, p⁺ back surface peripheral layer 26 is formed only in a portion of peripheral region 7 without surrounding active region 6.

Peripheral region 7 includes a field limiting ring structure (FLR structure) 21 at front surface 2a of semiconductor substrate 2. In a plan view of front surface 2a of semiconductor substrate 2, field limiting ring structure 21 surrounds active region 6. Field limiting ring structure 21 is a p type region. Field limiting ring structure 21 relaxes electric field concentration in peripheral region 7 to thereby improve the breakdown voltage of semiconductor apparatus 1. Field limiting ring structure 21 is spaced from and electrically insulated from first electrode 20.

Referring to FIGS. 1 to 5, an example method of manufacturing semiconductor apparatus 1 according to the first embodiment is described.

Figure 2:
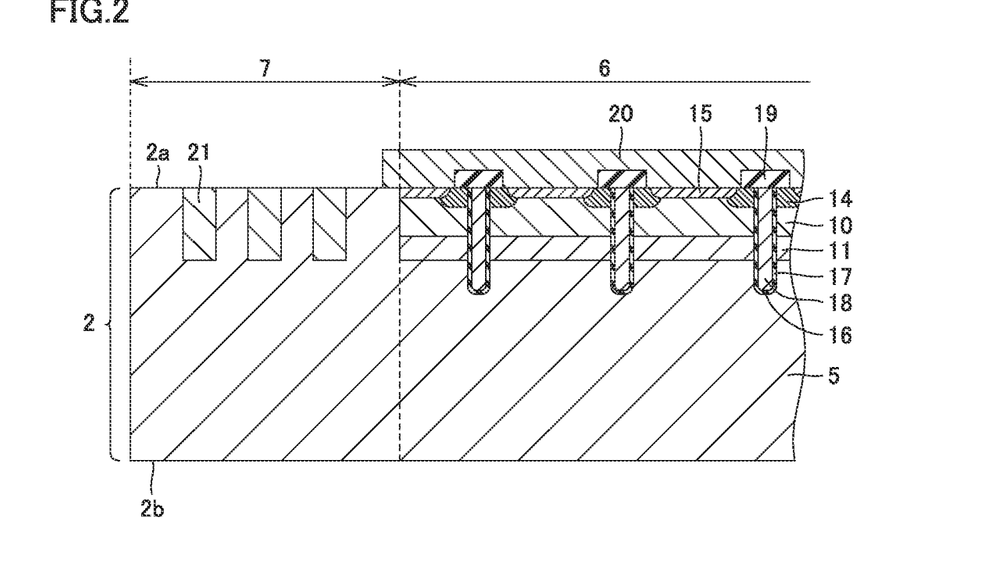
FIG. 2 is a schematic partial enlarged sectional view showing a step of a method of manufacturing the semiconductor apparatus according to the first embodiment and a semiconductor apparatus according to a third embodiment.

As shown in FIG. 2, the method of manufacturing semiconductor apparatus 1 of the present embodiment includes preparing semiconductor substrate 2 having part of the configuration of semiconductor device 3 formed on its front surface 2a side. Specifically, p base region 10, n⁺ type emitter region 14, p⁺ contact layer 15, n⁺ charge storage layer 11, gate insulating film 17, and gate electrode 18 are formed by a known method on the front surface 2a side in active region 6 of semiconductor substrate 2 (n⁻ drift region 5). Field limiting ring structure 21 is formed by a known method on the front surface 2a side in peripheral region 7 of semiconductor substrate 2 (n⁻ drift region 5). Interlayer insulating film 19 and first electrode 20 are formed on front surface 2a in active region 6 of semiconductor substrate 2. First electrode 20 is spaced from and electrically insulated from field limiting ring structure 21. First electrode 20 is in electrical conduction with n⁺ type emitter region 14 and p⁺ contact layer 15.

Back surface 2b of semiconductor substrate 2 is processed to reduce the thickness of semiconductor substrate 2 (n⁻ drift region 5). In one example, back surface 2b of semiconductor substrate 2 (n⁻ drift region 5) is ground with a grinder. In another example, back surface 2b of semiconductor substrate 2 (n⁻ drift region 5) is wet etched. The thickness of semiconductor substrate 2 (n⁻ drift region 5) is reduced to a thickness of 3 µm or more and 800 µm or less, without being particularly limited thereto.

Figure 3:
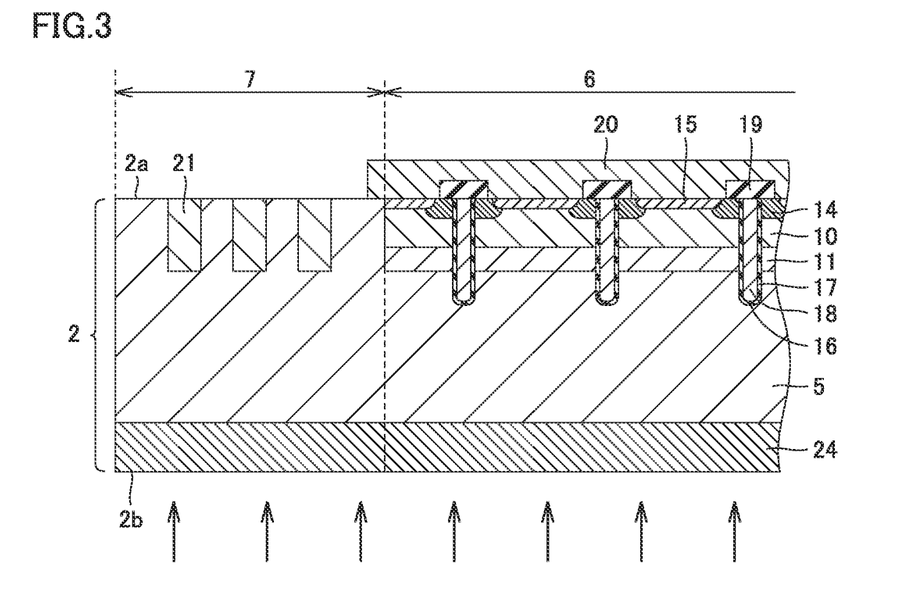
FIG. 3 is a schematic partial enlarged sectional view showing a step subsequent to the step shown in FIG. 2, in the method of manufacturing the semiconductor apparatuses according to the first and third embodiments.

As shown in FIG. 3, the method of manufacturing semiconductor apparatus 1 of the present embodiment includes doping back surface 2b with an n type dopant to thereby form n buffer layer 24 on back surface 2b. N buffer layer 24 is in contact with n⁻ drift region 5, and is provided closer to back surface 2b than n⁻ drift region 5. N buffer layer 24 is formed in active region 6 and peripheral region 7. The n type dopant is phosphorus or arsenic, for example. N buffer layer 24 is annealed for activating the n type dopant.

Figure 4:
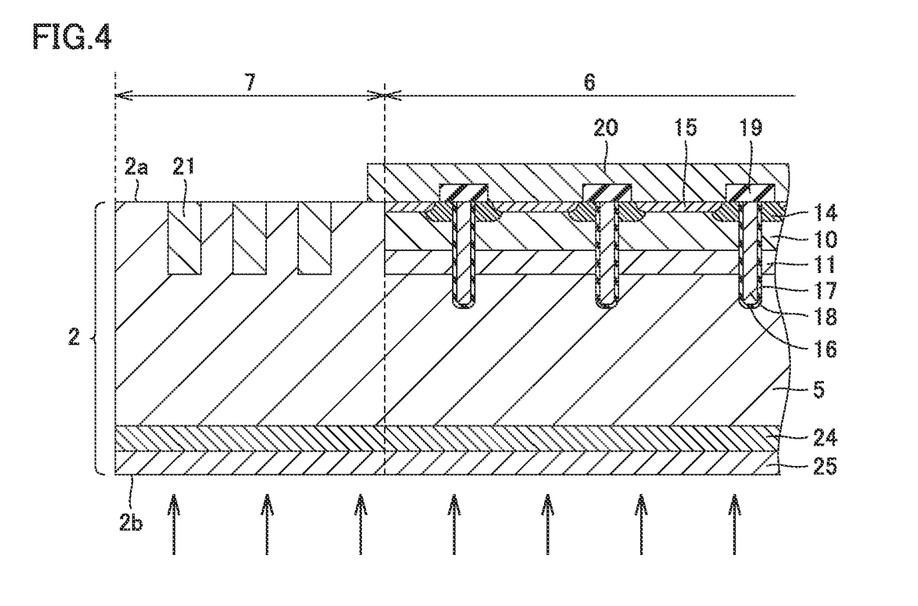
FIG. 4 is a schematic partial enlarged sectional view showing a step subsequent to the step shown in FIG. 3, in the method of manufacturing the semiconductor apparatuses according to the first and third embodiments.

As shown in FIG. 4, the method of manufacturing semiconductor apparatus 1 of the present embodiment includes doping back surface 2b with a p type dopant to thereby form p⁺ collector layer 25 on back surface 2b in active region 6 of semiconductor substrate 2. P⁺ collector layer 25 is also formed on back surface 2b in peripheral region 7 of semiconductor substrate 2. P⁺ collector layer 25 is in contact with n buffer layer 24. The p type dopant is boron, for example.

Figure 5:
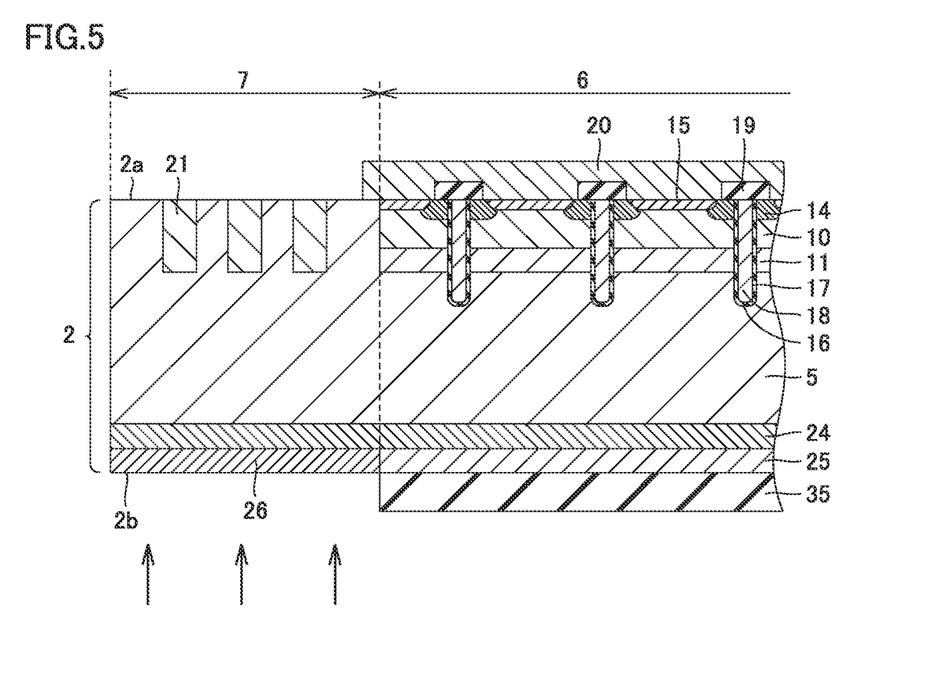
FIG. 5 is a schematic partial enlarged sectional view showing a step subsequent to the step shown in FIG. 4, in the method of manufacturing the semiconductor apparatuses according to the first and third embodiments.

As shown in FIG. 5, the method of manufacturing semiconductor apparatus 1 of the present embodiment includes selectively doping back surface 2b in peripheral region 7 with a p type dopant to thereby form $p^+$ back surface peripheral layer 26 on back surface 2b in peripheral region 7 of semiconductor substrate 2. Specifically, a mask 35 is formed on back surface 2b in active region 6 of semiconductor substrate 2. An ion implantation device is used to selectively implant a p type dopant such as boron into back surface 2b in peripheral region 7. $P^+$ back surface peripheral layer 26 is in contact with n buffer layer 24. $P^+$ back surface peripheral layer 26 is in contact with $p^+$ collector layer 25. $P^+$ back surface peripheral layer 26 is formed on back surface 2b of semiconductor substrate 2. The first p type carrier concentration in $p^+$ back surface peripheral layer 26 is higher than the second p type carrier concentration in $p^+$ collector layer 25. $P^+$ collector layer 25 and $p^+$ back surface peripheral layer 26 are annealed for activating the p type dopants included in $p^+$ collector layer 25 and $p^+$ back surface peripheral layer 26.

The method of manufacturing semiconductor apparatus 1 of the present embodiment includes forming second electrode 30 on $p^+$ collector layer 25 and $p^+$ back surface peripheral layer 26. Second electrode 30 is a stacked film of Al/Ti/Ni/Au, or a stacked film of AlSi/Ti/Ni/Au, for example. Second electrode 30, $p^+$ collector layer 25 and $p^+$ back surface peripheral layer 26 are annealed such that second electrode 30 makes ohmic contact with $p^+$ collector layer 25 and $p^+$ back surface peripheral layer 26. Semiconductor apparatus 1 of the present embodiment shown in FIG. 1 is thus obtained.

The operation and function of semiconductor apparatus 1 of the present embodiment are described, as compared to a semiconductor apparatus of a comparative example. The semiconductor apparatus of the comparative example has a similar configuration to semiconductor apparatus 1 of the present embodiment, but is different from semiconductor apparatus 1 of the present embodiment in that $p^+$ back surface peripheral layer 26 is not formed.

At a later stage of a turn-on process, at an earlier stage of a turn-off process, and in a switched-on state of the semiconductor apparatus (semiconductor apparatus 1 of the present embodiment, the semiconductor apparatus of the comparative example), a relatively low voltage is applied between first electrode 20 and second electrode 30. In the present specification, the turn-on process of the semiconductor apparatus means a process of transition from an OFF state to an ON state of the semiconductor apparatus. The turn-off process of the semiconductor apparatus means a process of transition from an ON state to an OFF state of the semiconductor apparatus.

During the low voltage period, a channel is formed in portion 12 of p base region 10. In the present specification, the low voltage period includes the turn-on process of the semiconductor apparatus, the turn-off process of the semiconductor apparatus, and a period during which semiconductor apparatus 1 is in a switched-on state. Electrons are injected from first electrode 20 into $n^-$ drift region 5 through this channel and $n^+$ charge storage layer 11. These injected electrons cause forward biasing to occur between $p^+$ collector layer 25 and $n^-$ drift region 5 with n buffer layer 24 interposed therebetween. Holes are injected from second electrode 30 and $p^+$ collector layer 25 into $n^-$ drift region 5 through n buffer layer 24. In this manner, the electrons and the holes are accumulated at high densities in $n^-$ drift region 5. Conductivity modulation occurs in $n^-$ drift region 5, resulting in a significantly reduced resistance of $n^-$ drift region 5. The voltage between first electrode 20 and second electrode 30 is relatively reduced.

During normal switching operation of the semiconductor apparatus (semiconductor apparatus 1 of the present embodiment, the semiconductor apparatus of the comparative example), in contrast, a high voltage is applied between first electrode 20 and second electrode 30 at an earlier stage of the turn-on process of the semiconductor apparatus and at a later stage of the turn-off process of the semiconductor apparatus. A high voltage is applied between first electrode 20 and second electrode 30 during a load short circuit as well. In the present specification, a period of a load short circuit means a period during which a load (such as a motor) connected to the semiconductor apparatus is short-circuited, causing a power supply voltage to be directly applied to the semiconductor apparatus.

During the high voltage period, therefore, in the semiconductor apparatus of the comparative example, the holes accumulated at a high density in $n^-$ drift region 5 are discharged from $n^-$ drift region 5, resulting in a significantly reduced density of holes in $n^-$ drift region 5. In the present specification, the high voltage period includes an earlier stage of the turn-on process of the semiconductor apparatus, a later stage of the turn-off process of the semiconductor apparatus, and the period of a load short circuit. Back surface electric field strength at a pn junction formed by $n^-$ drift region 5 and $p^+$ collector layer 25 increases. In the present embodiment, this pn junction is formed by $n^-$ drift region 5 and $p^+$ collector layer 25 with n buffer layer 24 interposed therebetween. In the semiconductor apparatus of the comparative example, during the high voltage period including the period of a load short circuit, a high back surface electric field continues to be applied to the pn junction formed by $n^-$ drift region 5 and $p^+$ collector layer 25. During the high voltage period including the period of a load short circuit, therefore, the amount of time before breakdown of the semiconductor apparatus of the comparative example is small, and the semiconductor apparatus of the comparative example has a low short-circuit capability.

On the other hand, semiconductor apparatus 1 of the present embodiment includes $p^+$ back surface peripheral layer 26 in peripheral region 7. During the high voltage period including the period of a load short circuit, therefore, holes are not only injected from second electrode 30 and $p^+$ collector layer 25 in active region 6 into $n^-$ drift region 5, but also injected from second electrode 30 and $p^+$ back surface peripheral layer 26 in peripheral region 7 into $n^-$ drift region 5. Since the first p type carrier concentration in $p^+$ back surface peripheral layer 26 is higher than the second p type carrier concentration in $p^+$ collector layer 25, more holes can be injected from $p^+$ back surface peripheral layer 26 into $n^-$ drift region 5. In this manner, the back surface electric field strength at the pn junction formed by $n^-$ drift region 5 and $p^+$ collector layer 25 decreases. Semiconductor apparatus 1 of the present embodiment can increase the amount of time before breakdown of semiconductor apparatus 1 during the high voltage period including the period of a load short circuit, thereby achieving an improved short-circuit capability.

The effect of semiconductor apparatus 1 of the present embodiment is described.

Semiconductor apparatus 1 of the present embodiment includes semiconductor substrate 2. Semiconductor substrate 2 includes active region 6 in which semiconductor device 3 is provided, and peripheral region 7 surrounding active region 6. Semiconductor substrate 2 has front surface 2a and back surface 2b. Semiconductor device 3 includes $n^-$ drift region 5, p base region 10, n⁺ type emitter region 14, gate insulating film 17, gate electrode 18, and p⁺ collector layer 25. Gate insulating film 17 is provided on portion 12 of p base region 10 between n⁺ type emitter region 14 and n⁻ drift region 5. Gate electrode 18 faces portion 12 of p base region 10 with gate insulating film 17 interposed therebetween. P⁺ collector layer 25 is provided on back surface 2b. Peripheral region 7 includes n⁻ drift region 5 and p⁺ back surface peripheral layer 26. N drift region 5 extends from active region 6 to peripheral region 7. P⁺ back surface peripheral layer 26 is provided on the back surface 2b side of n⁻ drift region 5. The first hole concentration in p⁺ back surface peripheral layer 26 is higher than the second hole concentration in p⁺ collector layer 25.

During a load short circuit, holes are injected not only from p⁺ collector layer 25 but also from p⁺ back surface peripheral layer 26 into n⁻ drift region 5. The back surface electric field strength at the pn junction formed by n⁻ drift region 5 and p⁺ collector layer 25 decreases. Semiconductor apparatus 1 of the present embodiment can increase the amount of time before breakdown of semiconductor apparatus 1 during a load short circuit, thereby achieving an improved short-circuit capability.

In semiconductor apparatus 1 of the present embodiment, p⁺ back surface peripheral layer 26 is in contact with p⁺ collector layer 25. During a load short circuit, therefore, holes can be efficiently injected from p⁺ back surface peripheral layer 26 into n⁻ drift region 5 through p⁺ collector layer 25. Semiconductor apparatus 1 of the present embodiment can achieve an improved short-circuit capability.

In semiconductor apparatus 1 of the present embodiment, semiconductor device 3 and peripheral region 7 include n buffer layer 24 on the back surface 2b side of n⁻ drift region 5. The first electron concentration in n buffer layer 24 is higher than the second electron concentration in n⁻ drift region 5. In active region 6, n buffer layer 24 is in contact with n⁻ drift region 5 and p⁺ collector layer 25. In peripheral region 7, p⁺ back surface peripheral layer 26 is provided on the back surface 2b side of n buffer layer 24. N buffer layer 24 functions as a field stop layer. N buffer layer 24 improves the breakdown voltage of semiconductor apparatus 1.

Second Embodiment

Figure 6:
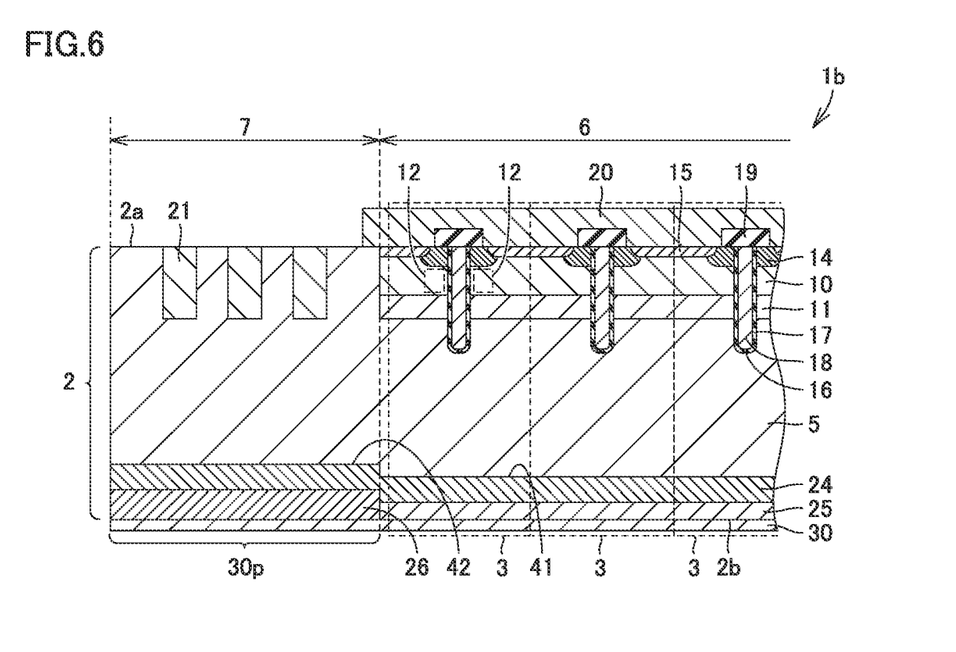
FIG. 6 is a schematic partial enlarged sectional view of a semiconductor apparatus according to a second embodiment.

Referring to FIG. 6, a semiconductor apparatus 1b according to a second embodiment is described. Semiconductor apparatus 1b of the present embodiment has a similar configuration and produces a similar effect to semiconductor apparatus 1 of the first embodiment, but is different mainly on the following points.

In semiconductor apparatus 1b of the present embodiment, p⁺ back surface peripheral layer 26 has a greater thickness than p⁺ collector layer 25. During the high voltage period including the period of a load short circuit, therefore, more holes are injected from p⁺ back surface peripheral layer 26 into n⁻ drift region 5. The back surface electric field strength at the pn junction formed by n⁻ drift region 5 and p⁺ collector layer 25 decreases further. Semiconductor apparatus 1b of the present embodiment can increase the amount of time before breakdown of semiconductor apparatus 1b during the high voltage period including the period of a load short circuit, thereby achieving an improved short-circuit capability.

In semiconductor apparatus 1b of the present embodiment, a first end 41 of n⁻ drift region 5 in active region 6 is located closer to back surface 2b than a second end 42 of n⁻ drift region 5 in peripheral region 7. First end 41 is an end of n⁻ drift region 5 in active region 6 proximal to back surface 2b. Second end 42 is an end of n⁻ drift region 5 in peripheral region 7 proximal to back surface 2b. N drift region 5 in active region 6 thereby has an increased thickness. The breakdown voltage of semiconductor apparatus 1b can be improved.

Third Embodiment

Figure 7:
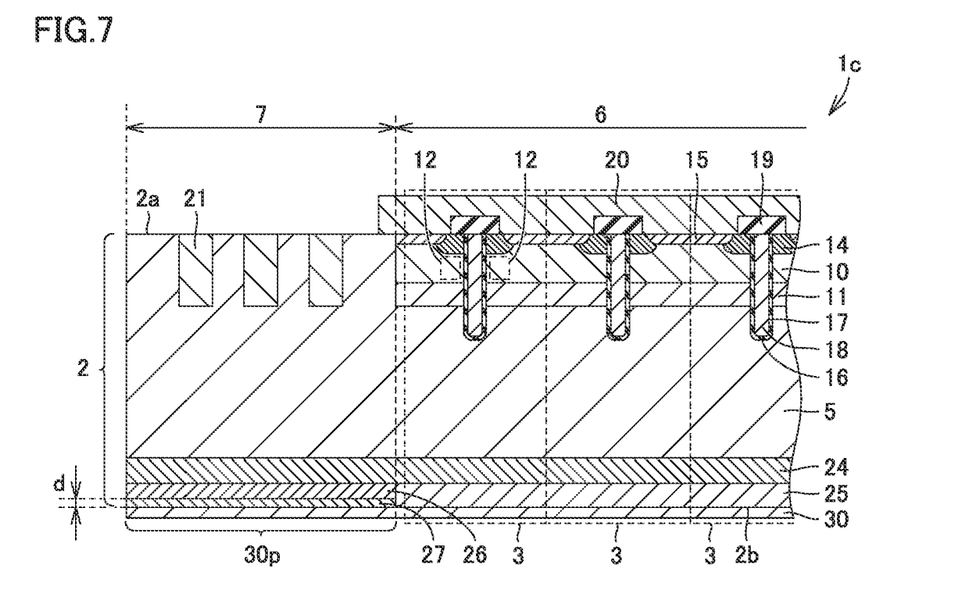
FIG. 7 is a schematic partial enlarged sectional view of the semiconductor apparatus according to the third embodiment.

Referring to FIG. 7, a semiconductor apparatus 1c according to a third embodiment is described. Semiconductor apparatus 1c of the present embodiment has a similar configuration to semiconductor apparatus 1 of the first embodiment, but is different mainly on the following points.

In semiconductor apparatus 1c of the present embodiment, peripheral region 7 further includes an n back surface peripheral layer 27 in contact with p⁺ back surface peripheral layer 26. N back surface peripheral layer 27 is provided on the back surface 2b side of p⁺ back surface peripheral layer 26. N back surface peripheral layer 27 is in contact with p⁺ collector layer 25. N back surface peripheral layer 27 is in contact with second electrode 30. N back surface peripheral layer 27 is provided on back surface 2b of semiconductor substrate 2. N back surface peripheral layer 27 has a smaller thickness than p⁺ back surface peripheral layer 26. N back surface peripheral layer 27 is configured such that the breakdown voltage of a pn junction formed by p⁺ back surface peripheral layer 26 and n back surface peripheral layer 27 is greater than ON voltage of semiconductor device 3. When semiconductor substrate 2 is a Si substrate, for example, n back surface peripheral layer 27 has a thickness d of 0.1 μm or more. Accordingly, in an ON state of semiconductor device 3, charge injection from the pn junction formed by p⁺ back surface peripheral layer 26 and n back surface peripheral layer 27 is prevented, so that switching loss of semiconductor apparatus 1c can be reduced.

An n type carrier concentration in n back surface peripheral layer 27 is higher than the n type carrier concentration in n⁻ drift region 5. The n type carrier concentration in n back surface peripheral layer 27 is higher than the n type carrier concentration in n buffer layer 24. N back surface peripheral layer 27 has an n type carrier concentration of $1.0 \times 10^{18}$ cm⁻³ or more, for example. N back surface peripheral layer 27 having such an electron concentration can cause, during a load short circuit, the pn junction formed by p⁺ back surface peripheral layer 26 and n back surface peripheral layer 27 to readily exhibit a tunnel effect.

Referring to FIGS. 2 to 5 and 8, an example method of manufacturing semiconductor apparatus 1c of the present embodiment is described. The method of manufacturing semiconductor apparatus 1c of the present embodiment includes similar steps to the method of manufacturing semiconductor apparatus 1 of the first embodiment, but is different mainly on the following points.

Figure 8:
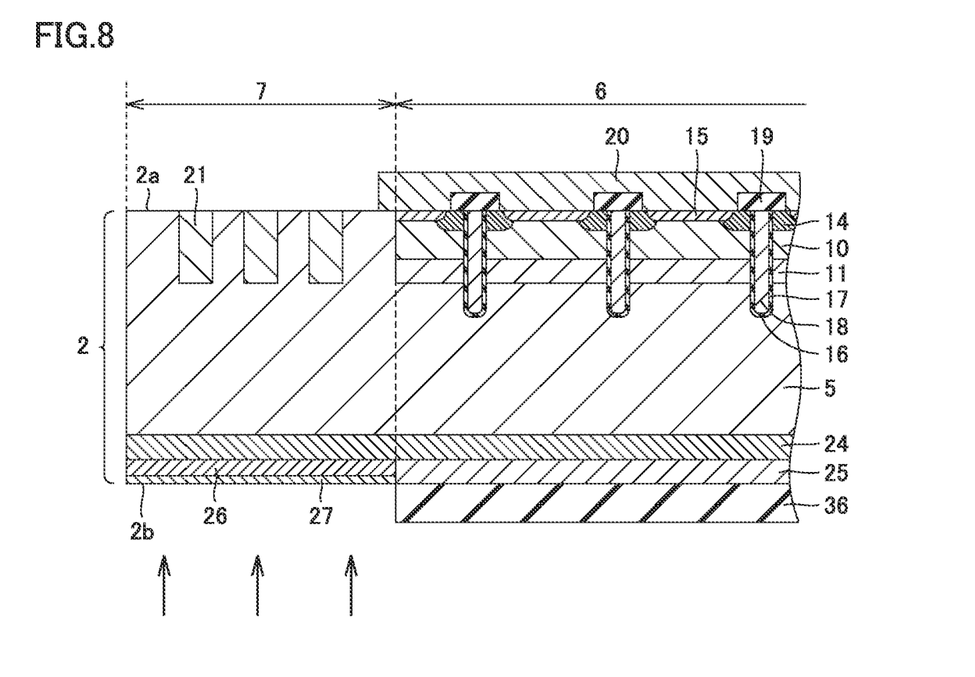
FIG. 8 is a schematic partial enlarged sectional view showing a step subsequent to the step shown in FIG. 5, in the method of manufacturing the semiconductor apparatus according to the third embodiment.

As shown in FIG. 8, the method of manufacturing semiconductor apparatus 1c of the present embodiment includes, subsequent to the steps shown in FIGS. 2 to 5, selectively doping back surface 2b in peripheral region 7 with an n type dopant to thereby form n back surface peripheral layer 27 on back surface 2b in peripheral region 7 of semiconductor substrate 2. Specifically, a mask 36 is formed on back surface 2b in active region 6 of semiconductor substrate 2. An ion implantation device is used to selectively implant an n type dopant such as phosphorus into back surface 2b in peripheral region 7. N back surface peripheral layer 27 is in contact with p⁺ back surface peripheral layer 26. N back surface peripheral layer 27 is formed on back surface 2b of semiconductor substrate 2. N back surface peripheral layer 27 is in contact with p+ collector layer 25. N back surface peripheral layer 27 is annealed for activating the n type dopant included in n back surface peripheral layer 27.

The method of manufacturing semiconductor apparatus 1c of the present embodiment includes forming second electrode 30 on p+ collector layer 25 and n back surface peripheral layer 27. In active region 6, second electrode 30 is in contact with p+ collector layer 25. In peripheral region 7, second electrode 30 is in contact with n back surface peripheral layer 27. Second electrode 30, p+ collector layer 25 and n back surface peripheral layer 27 are annealed such that second electrode 30 makes ohmic contact with p+ collector layer 25 and n back surface peripheral layer 27. Semiconductor apparatus 1 shown in FIG. 7 is thus obtained.

The operation and function of semiconductor apparatus 1c of the present embodiment are described.

The pn junction is formed by p+ back surface peripheral layer 26 and n back surface peripheral layer 27. During the low voltage period, a relatively small ON voltage is applied between first electrode 20 and second electrode 30, and therefore, the absolute value a reverse bias voltage applied to the pn junction formed by p+ back surface peripheral layer 26 and n back surface peripheral layer 27 is small. Holes cannot tunnel through this pn junction. During the low voltage period, this pn junction can prevent the injection of holes from a peripheral portion 30p of second electrode 30 and p+ back surface peripheral layer 26 into n− drift region 5, thereby suppressing an increase in the concentration of holes in n− drift region 5. The holes accumulated in n− drift region 5 in the turn-off process of semiconductor apparatus 1c are discharged from n− drift region 5 in a shorter amount of time. Power loss of semiconductor apparatus 1c can be reduced in the turn-off process.

During the high voltage period, in contrast, a large power supply voltage is applied between first electrode 20 and second electrode 30, and therefore, the absolute value of the reverse bias voltage applied to the pn junction formed by p+ back surface peripheral layer 26 and n back surface peripheral layer 27 is large. An avalanche breakdown phenomenon occurs at the pn junction formed by p+ back surface peripheral layer 26 and n back surface peripheral layer 27, thus allowing holes to tunnel through this pn junction. Alternatively, a tunnel effect at the pn junction formed by p+ back surface peripheral layer 26 and n back surface peripheral layer 27 allows holes to tunnel through this pn junction. The holes are injected into n− drift region 5 from peripheral portion 30p of second electrode 30 and p+ back surface peripheral layer 26 located in peripheral region 7. During the high voltage period, the back surface electric field strength at the pn junction formed by n− drift region 5 and p+ collector layer 25 can decrease. Semiconductor apparatus 1c of the present embodiment can increase the amount of time before breakdown of semiconductor apparatus 1c during the high voltage period including the period of a load short circuit, thereby achieving an improved short-circuit capability.

The effect of semiconductor apparatus 1c of the present embodiment is described. Semiconductor apparatus 1c of the present embodiment produces the following effect in addition to the effect of semiconductor apparatus 1 of the first embodiment.

In semiconductor apparatus 1c of the present embodiment, peripheral region 7 further includes n back surface peripheral layer 27 in contact with p+ back surface peripheral layer 26. N back surface peripheral layer 27 is provided on the back surface 2b side of p+ back surface peripheral layer 26. According to semiconductor apparatus 1c of the present embodiment, the short-circuit capability of semiconductor apparatus 1c can be improved while power loss of semiconductor apparatus 1c that occurs during the turn-off process of semiconductor apparatus 1c is reduced.

In semiconductor apparatus 1c of the present embodiment, n back surface peripheral layer 27 has a smaller thickness than p+ back surface peripheral layer 26. Accordingly, a reduction in the amount of holes injected into n− drift region 5 from p+ back surface peripheral layer 26 during a load short circuit is suppressed. The short-circuit capability of semiconductor apparatus 1c can be improved.

Fourth Embodiment

Figure 9:
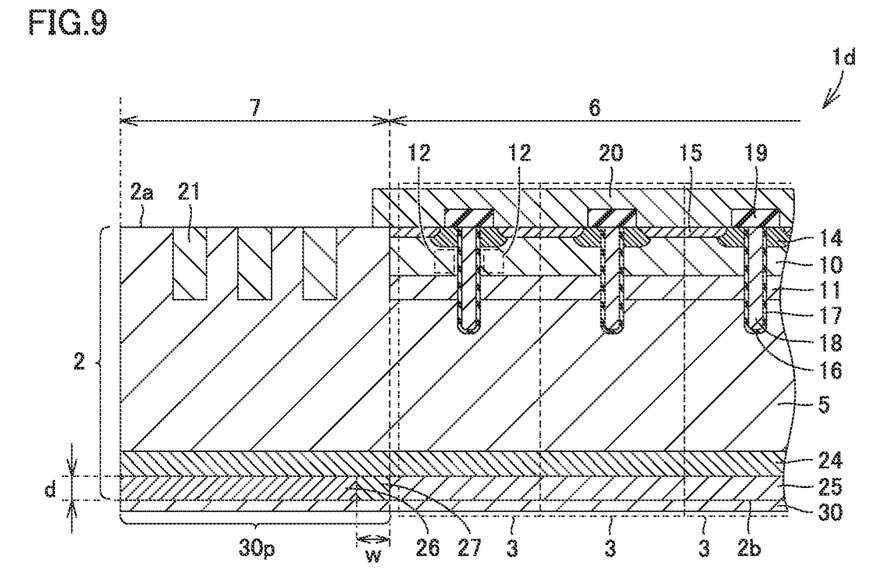
FIG. 9 is a schematic partial enlarged sectional view of a semiconductor apparatus according to a fourth embodiment.

Referring to FIG. 9, a semiconductor apparatus 1d according to a fourth embodiment is described. Semiconductor apparatus 1d of the present embodiment has a similar configuration to semiconductor apparatus 1c of the third embodiment, but is different mainly on the following points.

In semiconductor apparatus 1d of the present embodiment, n back surface peripheral layer 27 is provided between p+ back surface peripheral layer 26 and p+ collector layer 25. N back surface peripheral layer 27 is in contact with n buffer layer 24. N back surface peripheral layer 27 is in contact with p+ collector layer 25. N back surface peripheral layer 27 is in contact with second electrode 30. In one example, n back surface peripheral layer 27 has the same thickness as p+ back surface peripheral layer 26. In another example, n back surface peripheral layer 27 has a smaller thickness than p+ back surface peripheral layer 26. N back surface peripheral layer 27 has a width w smaller than the width of p+ back surface peripheral layer 26. N back surface peripheral layer 27 has a width of 0.1 μm or more, for example. The n type carrier concentration in n back surface peripheral layer 27 is higher than the n type carrier concentration in n− drift region 5. The n type carrier concentration in n back surface peripheral layer 27 is higher than the n type carrier concentration in n buffer layer 24.

Semiconductor apparatus 1d of the present embodiment has a similar function and produces a similar effect to semiconductor apparatus 1c of the third embodiment, as described below.

N back surface peripheral layer 27 of the present embodiment has a similar function to n back surface peripheral layer 27 of the third embodiment. Specifically, the pn junction is formed by p+ back surface peripheral layer 26 and n back surface peripheral layer 27. During the low voltage period, the holes injected from peripheral portion 30p of second electrode 30 located in peripheral region 7 cannot tunnel through this pn junction. During the low voltage period, this pn junction can prevent the injection of holes from peripheral portion 30p of second electrode 30 and p+ back surface peripheral layer 26 into n− drift region 5, thereby suppressing an increase in the concentration of holes in n− drift region 5. The holes accumulated in n− drift region 5 in the turn-off process of semiconductor apparatus 1d are discharged from n− drift region 5 in a shorter amount of time. Power loss of semiconductor apparatus 1d can be reduced in the turn-off process.

During the high voltage period, in contrast, a large power supply voltage is applied between first electrode 20 and second electrode 30, and therefore, the absolute value of the reverse bias voltage applied to the pn junction formed by p+ back surface peripheral layer 26 and n back surface peripheral layer 27 is large. The holes injected from peripheral portion 30p of second electrode 30 located in peripheral region 7 exceed a built-in potential of this pn junction and are injected into n⁻ drift region 5. During the high voltage period, the back surface electric field strength at the pn junction formed by n⁻ drift region 5 and p⁺ collector layer 25 can decrease. Semiconductor apparatus 1d of the present embodiment can increase the amount of time before breakdown of semiconductor apparatus 1d during the high voltage period including the period of a load short circuit, thereby achieving an improved short-circuit capability.

It should be understood that the first to fourth embodiments disclosed herein are illustrative and non-restrictive in every respect. At least two of the first to fourth embodiments disclosed herein can be combined together within the range where inconsistency does not occur. The scope of the present invention is defined by the terms of the claims, rather than the description above, and is intended to include any modifications within the meaning and scope equivalent to the terms of the claims.

What is claimed is:

1. A semiconductor apparatus comprising a semiconductor substrate, the semiconductor substrate including an active region in which a semiconductor device is provided, and a peripheral region surrounding the active region, the semiconductor substrate having a front surface and a back surface,
   the semiconductor device including an n− drift region, a p base region, an n+ type emitter region, a gate insulating film provided on a portion of the p base region between the n+ type emitter region and the n− drift region, a gate electrode facing the portion of the p base region with the gate insulating film interposed therebetween, and a p+ collector layer provided on the back surface,
   the peripheral region including the n− drift region and a p+ back surface peripheral layer, the n− drift region extending from the active region to the peripheral region, the p+ back surface peripheral layer being provided on the back surface side of the n− drift region,
   a first peak hole concentration in the p+ back surface peripheral layer being higher than a second peak hole concentration in the p+ collector layer, such that the first peak hole concentration is a maximum value of a hole concentration profile along a thickness of the p+ back surface peripheral layer, and the second peak hole concentration is a maximum value of a hole concentration profile along a thickness of the p+ collector layer.

2. The semiconductor apparatus according to claim 1, wherein
   a first end of the n− drift region in the active region is located closer to the back surface than a second end of the n− drift region in the peripheral region,
   the first end is an end of the n− drift region in the active region proximal to the back surface, and
   the second end is an end of the n− drift region in the peripheral region proximal to the back surface.

3. The semiconductor apparatus according to claim 1, wherein
   the p+ back surface peripheral layer is in contact with the p+ collector layer.

4. The semiconductor apparatus according to claim 1, wherein
   the semiconductor device and the peripheral region include an n buffer layer on the back surface side of the n− drift region,
   a first electron concentration in the n buffer layer is higher than a second electron concentration in the n− drift region,
   in the active region, the n buffer layer is in contact with the n− drift region and the p+ collector layer, and
   in the peripheral region, the p+ back surface peripheral layer is provided on the back surface side of the n buffer layer.

5. The semiconductor apparatus according to claim 1, wherein
   the peripheral region includes a field limiting ring structure at the front surface.

6. A semiconductor apparatus comprising a semiconductor substrate, the semiconductor substrate including an active region in which a semiconductor device is provided, and a peripheral region surrounding the active region, the semiconductor substrate having a front surface and a back surface,
   the semiconductor device including an n− drift region, a p base region, an n+ type emitter region, a gate insulating film provided on a portion of the p base region between the n+ type emitter region and the n− drift region, a gate electrode facing the portion of the p base region with the gate insulating film interposed therebetween, and a p+ collector layer provided on the back surface,
   the peripheral region including the n− drift region and a p+ back surface peripheral layer, the n− drift region extending from the active region to the peripheral region, the p+ back surface peripheral layer being provided on the back surface side of the n− drift region,
   a first hole concentration in the p+ back surface peripheral layer being higher than a second hole concentration in the p+ collector layer, and
   the p+ back surface peripheral layer has a greater thickness than the p+ collector layer.

7. The semiconductor apparatus according to claim 6, wherein
   a first end of the n− drift region in the active region is located closer to the back surface than a second end of the n− drift region in the peripheral region,
   the first end is an end of the n− drift region in the active region proximal to the back surface, and
   the second end is an end of the n− drift region in the peripheral region proximal to the back surface.

8. The semiconductor apparatus according to claim 6, wherein
   the p+ back surface peripheral layer is in contact with the p+ collector layer.

9. The semiconductor apparatus according to claim 6, wherein
   the semiconductor device and the peripheral region include an n buffer layer on the back surface side of the n− drift region,
   a first electron concentration in the n buffer layer is higher than a second electron concentration in the n− drift region,
   in the active region, the n buffer layer is in contact with the n− drift region and the p+ collector layer, and
   in the peripheral region, the p+ back surface peripheral layer is provided on the back surface side of the n buffer layer.

10. The semiconductor apparatus according to claim 6, wherein
    the peripheral region includes a field limiting ring structure at the front surface.

11. A semiconductor apparatus comprising a semiconductor substrate, the semiconductor substrate including an active region in which a semiconductor device is provided, and a peripheral region surrounding the active region, the semiconductor substrate having a front surface and a back surface,
- the semiconductor device including an n− drift region, a p base region, an n+ type emitter region, a gate insulating film provided on a portion of the p base region between the n+ type emitter region and the n− drift region, a gate electrode facing the portion of the p base region with the gate insulating film interposed therebetween, and a p+ collector layer provided on the back surface,
- the peripheral region including the n− drift region and a p+ back surface peripheral layer, the n− drift region extending from the active region to the peripheral region, the p+ back surface peripheral layer being provided on the back surface side of the n− drift region,
- a first hole concentration in the p+ back surface peripheral layer being higher than a second hole concentration in the p+ collector layer,
- the peripheral region further includes an n back surface peripheral layer in contact with the p+ back surface peripheral layer, and
- the n back surface peripheral layer is provided on the back surface side of the p+ back surface peripheral layer.

12. The semiconductor apparatus according to claim 11, wherein
the n back surface peripheral layer has a smaller thickness than the p+ back surface peripheral layer.

13. The semiconductor apparatus according to claim 11, wherein
the p+ back surface peripheral layer is in contact with the p+ collector layer.

14. The semiconductor apparatus according to claim 11, wherein
- the semiconductor device and the peripheral region include an n buffer layer on the back surface side of the n− drift region,
- a first electron concentration in the n buffer layer is higher than a second electron concentration in the n− drift region,
- in the active region, the n buffer layer is in contact with the n− drift region and the p+ collector layer, and
- in the peripheral region, the p+ back surface peripheral layer is provided on the back surface side of the n buffer layer.

15. The semiconductor apparatus according to claim 11, wherein
the peripheral region includes a field limiting ring structure at the front surface.

16. A semiconductor apparatus comprising a semiconductor substrate, the semiconductor substrate including an active region in which a semiconductor device is provided, and a peripheral region surrounding the active region, the semiconductor substrate having a front surface and a back surface,
- the semiconductor device including an n− drift region, a p base region, an n+ type emitter region, a gate insulating film provided on a portion of the p base region between the n+ type emitter region and the n− drift region, a gate electrode facing the portion of the p base region with the gate insulating film interposed therebetween, and a p+ collector layer provided on the back surface,
- the peripheral region including the n− drift region and a p+ back surface peripheral layer, the n− drift region extending from the active region to the peripheral region, the p+ back surface peripheral layer being provided on the back surface side of the n− drift region,
- a first hole concentration in the p+ back surface peripheral layer being higher than a second hole concentration in the p+ collector layer,
- the peripheral region further includes an n back surface peripheral layer in contact with the p+ back surface peripheral layer, and
- the n back surface peripheral layer is provided between the p+ back surface peripheral layer and the p+ collector layer.

17. The semiconductor apparatus according to claim 16, wherein
- the semiconductor device and the peripheral region include an n buffer layer on the back surface side of the n− drift region,
- a first electron concentration in the n buffer layer is higher than a second electron concentration in the n− drift region,
- in the active region, the n buffer layer is in contact with the n− drift region and the p+ collector layer, and
- in the peripheral region, the p+ back surface peripheral layer is provided on the back surface side of the n buffer layer.

18. The semiconductor apparatus according to claim 16, wherein
the peripheral region includes a field limiting ring structure at the front surface.

* * * * *